United States Patent
Kim

(10) Patent No.: US 6,661,163 B2
(45) Date of Patent: Dec. 9, 2003

(54) TEMPERATURE COMPENSATED CRYSTAL OSCILLATOR AND METHOD OF MANUFACTURING THE SAME

(75) Inventor: Hyung Kon Kim, Suwon (KR)

(73) Assignee: Samsung Electro-Mechanics Co., Ltd., Kyungki-do (KR)

( * ) Notice: Subject to any disclaimer, the term of this patent is extended or adjusted under 35 U.S.C. 154(b) by 0 days.

(21) Appl. No.: 10/137,327

(22) Filed: May 3, 2002

(65) Prior Publication Data

US 2003/0122452 A1 Jul. 3, 2003

(30) Foreign Application Priority Data

Dec. 27, 2001 (KR) ........................................ 2001-85733

(51) Int. Cl.⁷ ............................................ H01L 41/053

(52) U.S. Cl. ...................................................... 310/346

(58) Field of Search ................................ 310/315, 346, 310/348

(56) References Cited

U.S. PATENT DOCUMENTS

| 6,093,997 A | * | 7/2000 | Zimnicki et al. | ............ 310/352 |
| 6,380,662 B2 | * | 4/2002 | Funahara et al. | ............ 310/348 |
| 2001/0015890 A1 | * | 8/2001 | Funahara et al. | ............ 361/761 |
| 2001/0019292 A1 | * | 9/2001 | Funahara et al. | ............. 331/68 |

FOREIGN PATENT DOCUMENTS

| JP | 8-37421 | * | 2/1996 | ............ H03B/5/32 |
| JP | 2000-156610 | | 6/2000 | ............ H03B/5/32 |

* cited by examiner

*Primary Examiner*—Thomas M. Dougherty
(74) *Attorney, Agent, or Firm*—Lowe Hauptman Gilman & Berner LLP

(57) ABSTRACT

A temperature compensated crystal oscillator is manufactured by placing a ring-shaped board on a main board to surround compensating components on the main board, and placing a crystal package on the ring-shaped board. A component mounting area on the main board is reduced, thereby reducing a product size. At least one conductive pad may be attached to the ring-shaped board to connect the crystal package to a certain circuit on the main board. The conductive pad may be provided at each of four corners of a rectangular ring-shaped board.

17 Claims, 6 Drawing Sheets

TEMPERATURE COMPENSATED CRYSTAL OSCILLATOR AND METHOD OF MANUFACTURING THE SAME

BACKGROUND OF THE INVENTION

1. Field of the Invention

The present invention relates to a temperature compensated crystal oscillator and a method of manufacturing the oscillator, and more particularly to a temperature compensated crystal oscillator and a method of manufacturing the oscillator which is intended to achieve compactness of a product by interposing a ring-shaped board having an inner space adapted to accommodate temperature compensating components between a main board and a crystal package.

2. Description of the Prior Art

A crystal oscillator employing a quartz oscillator is an essential component used to generate an oscillation frequency for controlling transmission and reception of signals between mobile communication terminals, and is superior to other oscillators in terms of frequency stability. However, the quartz oscillator has a drawback in that its oscillation frequency varies depending on ambient temperature. To overcome this drawback, the crystal oscillator must be additionally provided with certain components for compensating frequency variation owing to temperature characteristics of the quartz oscillator. Such a crystal oscillator is referred to as a temperature compensated crystal oscillator (TCXO).

In general, a temperature compensating circuit of the TCXO comprises a temperature detection circuit employing resistance variation of a thermistor, a controlled voltage generating circuit for controlling a voltage according to the resistance variation, and a frequency adjusting circuit for adjusting frequency by capacitance regulation according to the controlled voltage. According to presence of the temperature compensating circuit, the TCXO is classified into a one-chip type TCXO using an integrated circuit (IC) chip, and a discrete type TCXO having components such as piezoelectric elements, integrated circuits, capacitors, inductors and resistive elements mounted thereon.

In general, although the discrete type TCXO is superior to the one-chip type TCXO in terms of phase noise characteristic, the discrete type TCXO is difficult to be made compact because it must contain various components. Accordingly, the discrete type TCXO is severely restricted in its adoption into a mobile communication terminal due to its large size despite its excellent characteristics.

FIGS. 1a and 1b are a plan view and a side view showing a conventional discrete type TCXO 100. As shown in FIG. 1a, the discrete type TCXO 100 is configured to have a printed circuit board 101, a crystal package 103 mounted on the printed circuit board 101, and components 105 of a temperature compensating circuit arranged at both sides of the crystal package 103. As appreciated from FIG. 1b, the components 105 are positioned at a level lower than that of the crystal package 103.

The temperature compensating components 105 usually occupy an area 2 to 3 times as large as an area of the TCXO 100 (5.0×3.2 $mm^2$ or 4.7×2.9 $mm^2$). Consequently, the printed circuit board 101 incorporated in the TCXO requires an area far larger than that of the TCXO. Hence, an area of a finished product will also become large (for example, 7.0×5.2 $mm^2$)

As such, there is a considerable limitation to compactness of a conventional temperature compensated crystal oscillator because of a space required to accommodate the temperature compensating components. On this account, such a discrete type TCXO cannot be successfully adopted into mobile communication terminals.

Therefore, there has been strongly required a temperature compensated crystal oscillator and a method of manufacturing the same in the art, in which a space for accommodating temperature compensating components is minimized.

SUMMARY OF THE INVENTION

Accordingly, the present invention has been made keeping in mind the above problems occurring in the prior art, and an object of the present invention is to provide a temperature compensated crystal oscillator which is intended to achieve compactness of a product by a ring-shaped board having an inner space adapted to accommodate temperature compensating components on a main board.

Another object of the present invention is to provide a method of manufacturing the temperature compensated crystal oscillator.

In order to accomplish the above object, the present invention provides a temperature compensated crystal oscillator including a crystal package and at least one component for compensating frequency variation of the crystal package due to temperature variation, the crystal oscillator comprising: a ring-shaped board disposed under the crystal package and comprised of a frame structure having an inner space, the inner space at least as large as a space required to accommodate the temperature compensating component; and a main board disposed under the ring-shaped board and on which the temperature compensating component is mounted within an area corresponding to the inner space of the ring-shaped board.

According to a preferred embodiment of the present invention, the ring-shaped board may have a frame structure coinciding with the crystal package in contour, and the main board may have the same area as that of the crystal package. Therefore, the temperature compensated crystal oscillator can be a finished hexahedral product having the same area as that of the crystal package.

According to another embodiment of the present invention, the ring-shaped board may include at least one conductive pad for connecting the crystal package to a certain circuit on the main board. In particular, when the ring-shaped board has a rectangular structure, the conductive pad is preferably positioned at each of four corners of the ring-shaped board because the crystal package is usually provided at its corners with connecting terminals. Accordingly, if connecting terminals on the crystal package are changed in position, the conductive pad can be correspondingly positioned.

Furthermore, the present invention provides a method of manufacturing a temperature compensated crystal oscillator including a crystal package and at least one component for compensating frequency variation of the crystal package due to temperature variation, the method comprising the steps of: preparing a main board having an upper surface including an area required for mounting of the temperature compensating component; placing the temperature compensating component on the component mounting area of the main board; placing a ring-shaped board on the main board, the ring-shaped board having an inner space at least as large as the component mounting area; and placing the crystal package on the ring-shaped package.

BRIEF DESCRIPTION OF THE DRAWINGS

The above and other objects, features and other advantages of the present invention will be more clearly understood from the following detailed description taken in conjunction with the accompanying drawings, in which:

FIG. 1b is a side view of FIG. 1a;

DETAILED DESCRIPTION OF THE INVENTION

This invention will be described in further detail by way of example with reference to the accompanying drawings.

Figure 1A:
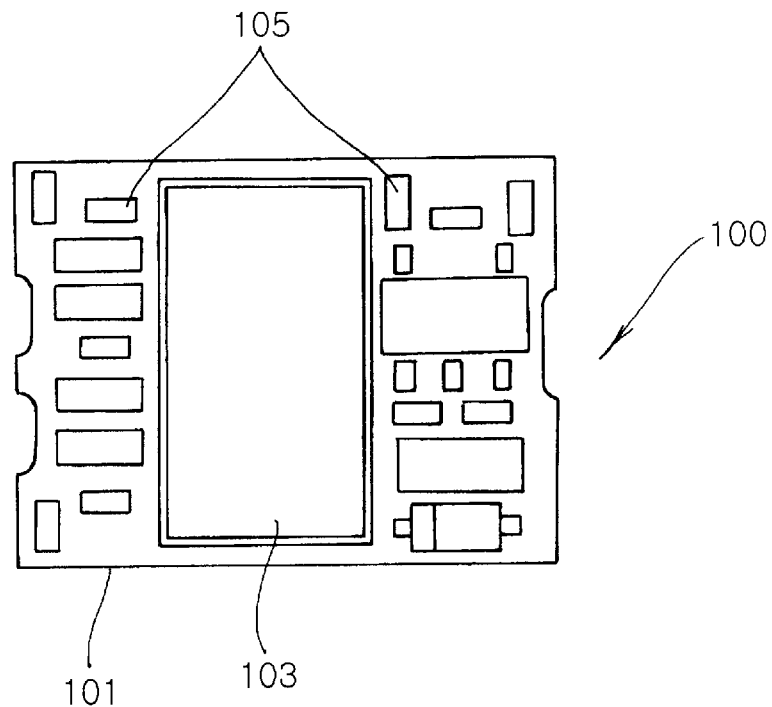
FIG. 1a is a plan view showing a conventional discrete type TCXO.
Figure 1B:
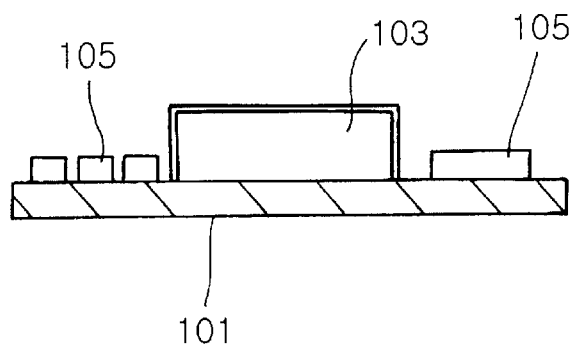
Figure 2:
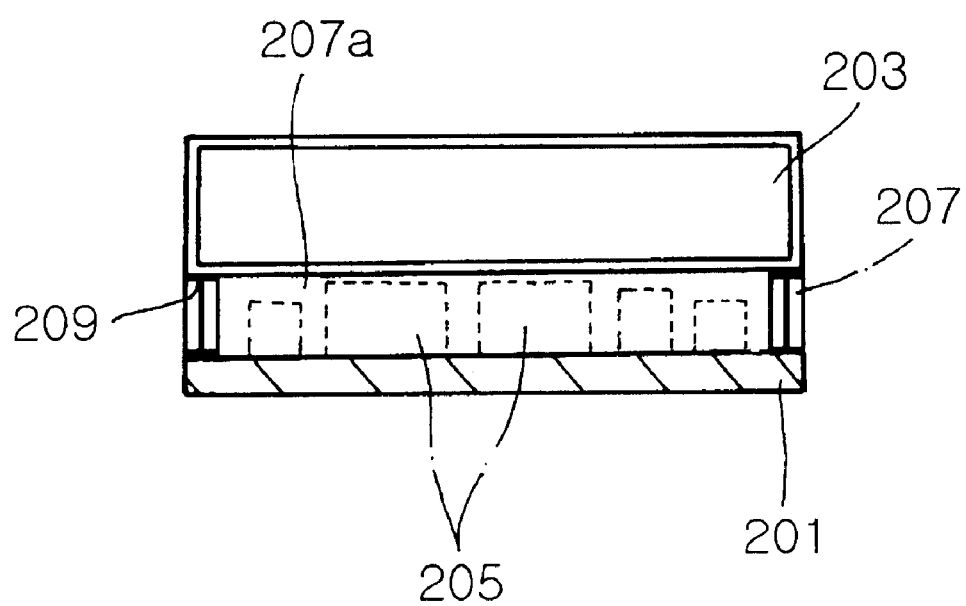
FIG. 2 is a side cross-sectional view of a temperature compensated crystal oscillator according to an embodiment of the present invention.

FIG. 2 is a side cross-sectional view of a temperature compensated crystal oscillator according to an embodiment of the present invention.

As shown in the drawing, the temperature compensated crystal oscillator 200 is configured to be a layering of a main board 201, a ring-shaped board 207 and a crystal package 203 in this order from bottom to top.

The main board 201 is provided thereon with piezoelectric devices, integrated circuits, capacitors, inductors and resistive elements to comprise a temperature compensating circuit. A region 207a for accommodating components for constituting a temperature compensating circuit is defined by the ring-shaped board. The ring-shaped board 207 is a frame structure configured to have a space therein, so that the ring-shaped board 207 mounted on the main board would not only support the crystal package 203 placed thereon but also assure a space sufficient to accommodate the components in its inner space 207a. The ring-shaped board 207 is provided at its upper and lower surface with conductive regions. The upper and lower conductive regions are electrically connected by a plurality of conductive pads 209 consisting of holes filed with conductive substances. The conductive pads 209 may be formed into various shapes, and function to electrically connect the crystal package 203 on the ring-shaped board 207 to a circuit formed on the main board 201.

Although the main board may be made from any of various materials, it is preferable to use the same material as that of a usual printed circuit board rather than fragile glass epoxy or ceramic resin.

In this embodiment, the ring-shaped board and the main board are configured to coincide with dimensions of the crystal package. That is, the ring-shaped board is designed to coincide with a contour of the crystal package, and the main board is designed to have the same area as that of the crystal package. As a result, the temperature compensated crystal oscillator can be embodied to match an area of the crystal package.

In variance of height, although an overall height of the temperature compensated crystal oscillator is somewhat increased, heights of the components are low relative to an overall height of a finished product (overall height of a finished product: 0.35 cm, height of a component: 01—0.15 cm, in case of a conventional product), so that a height of the ring-shaped board can be properly depressed. Therefore, an increment of overall height of a finished product can be no more than a height of a component. On the other hand, the temperature compensated crystal oscillator can be considerably reduced in area because an area required to accommodate components for temperature compensating circuit is about three times as large as that of a quartz oscillator in a conventional temperature compensated crystal oscillator. Considering both the factors together, the temperature compensated crystal oscillator according to the present invention can be remarkably reduced in its volume.

The size of the ring-shaped board or the main board is disclosed as only an example, and is not intended to limit the scope of the present invention.

As described above, the present invention is characterized in that a ring-shaped board having a frame structure is interposed between a main board and a crystal package to provide a space for accommodating components therein. Therefore, since a space for accommodating components for constituting a temperature compensating circuit can be defined by a ring-shaped board and a main board, an overall area of a printed circuit board can be minimized, thereby enabling minimization of volume of a finished product.

Figure 3A:
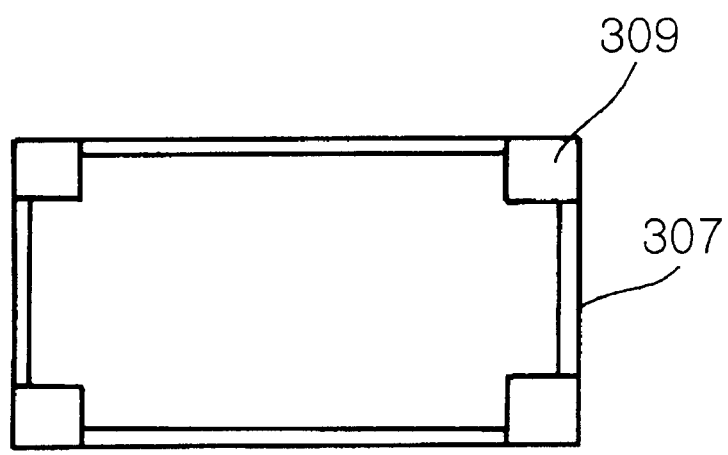
FIGS. 3a and 3b are plan views showing a ring-shaped board adopted in the present invention.
Figure 3B:
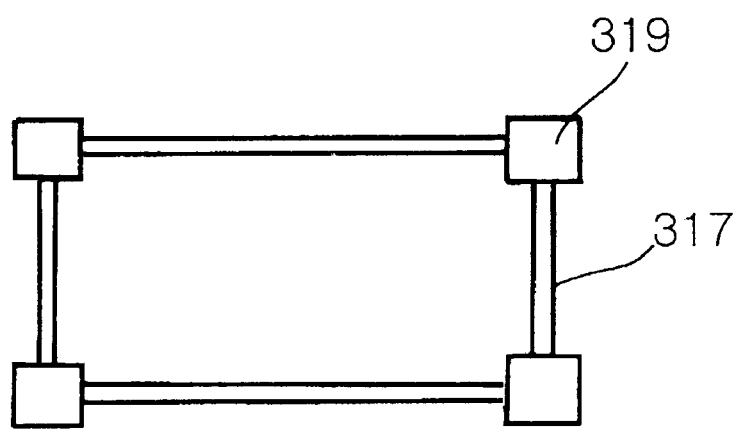

FIGS. 3a and 3b are plan views showing two examples of a ring-shaped board adopted in the present invention.

As shown in FIG. 3a, a ring-shaped board 307 has a rectangular frame structure, and may be made from material of a printed circuit board as in the above description. The ring-shaped board is provided with conductive pads 309 at its four corners, respectively. The conductive pads 309 function to electrically connect a crystal package to be placed thereon to a circuit of the main board to be placed thereunder. Although the conductive pads 309 may be separately positioned in a space for accommodating components, it is preferable to be positioned on the ring-shaped board for the sake of convenience of design and process. In particular, since a crystal package is attached at its lower corners with conductive pads, when the ring-shaped board 307 coinciding with the contour of the crystal package is manufactured, the conductive pads 209 are required to be attached to the ring-shaped board as illustrated in FIG. 3a.

Alternatively, a ring-shaped board 317 may be configured to be positioned somewhat inside of the contour of a crystal package, as shown in FIG. 3b. In this case, conductive pads 319 are positioned to slightly protrude from a rectangular frame of the ring-shaped board.

As such, the ring-shaped board equipped with conductive pads may be embodied into various shapes, other than the shapes mentioned above. For example, where terminals are positioned at middle portions of sides of a crystal package rather than at its corners, the conductive pads may be positioned at middle portions of sides of the ring-shaped board.

Although the ring-shaped board 307 is not necessarily required to be shaped into a rectangular frame, it is preferable that the ring-shaped board is configured to be a rectangular frame so as to minimize the finished product.

Figure 4:
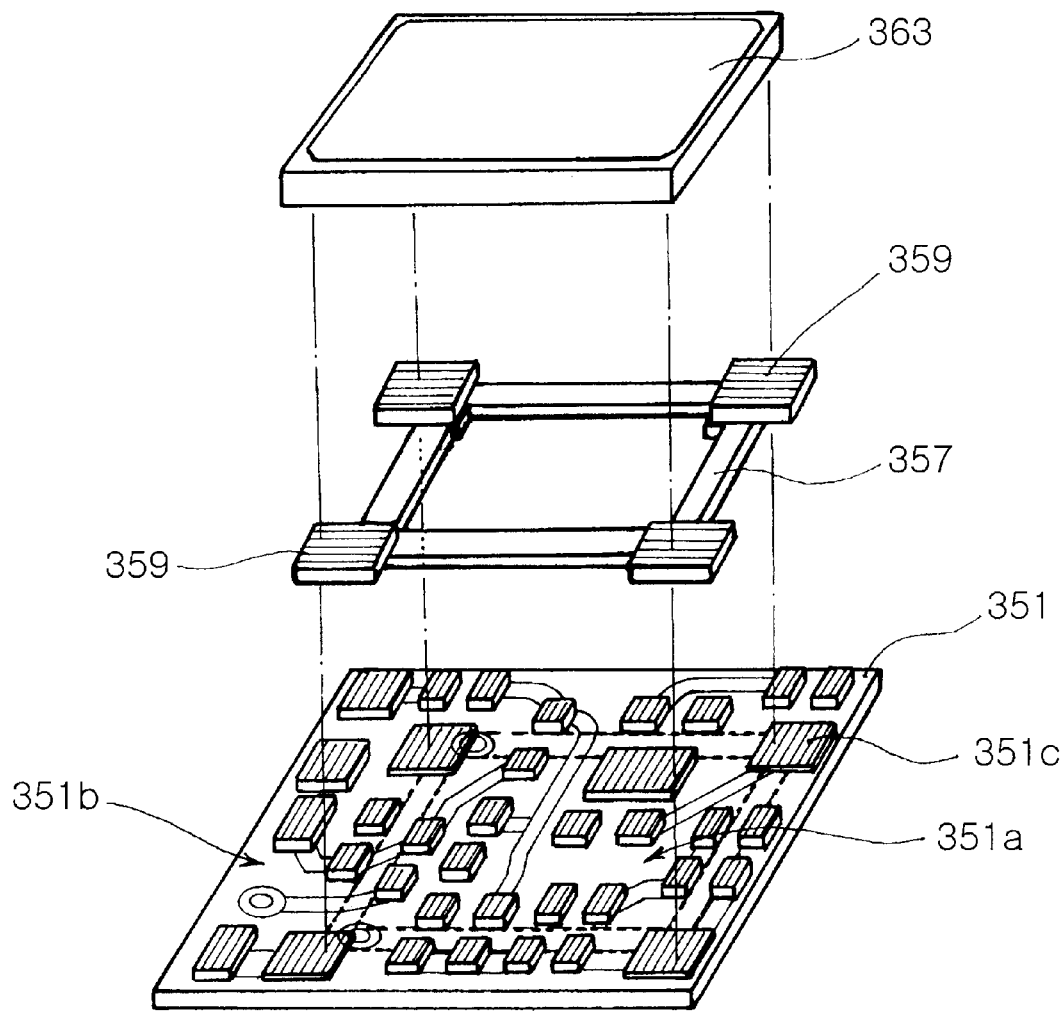
FIG. 4 is an exploded perspective view showing a temperature compensated crystal oscillator according to the present invention.

FIG. 4 is an exploded perspective view of a temperature compensated crystal oscillator according to present invention. As shown in the drawing, the temperature compensated crystal oscillator comprises a crystal package 363, a ring-shaped board 357, and a main board 351 on which components are mounted. The ring-shaped board 357 is provided at its corners with four conductive pads 359. In this embodiment, the main board 351 is larger than the crystal package 363 or the ring-shaped board 357 in area. The ring-shaped board 357 is disposed on the main board 351 such that its rectangular frame is located at a region indicated by dotted lines on an upper surface of the main board 351. Accordingly, the conductive pads 359 are in contact with the terminals 351c of the main board 351. In particular, the main board adopted in this embodiment affords an external area 351b outside the dotted lined region as well as an internal area 351a, so that the main board can accommodate additional components in the external area 351a. In this case, it is preferable that the external area of the main board is mounted with components required to adjust final frequency after completion of a process for manufacturing the temperature compensated crystal oscillator.

FIGS. 5a to 5d are a perspective view and cross-sectional view showing a process of manufacturing a temperature compensated crystal oscillator according to present invention.

Figure 5A:
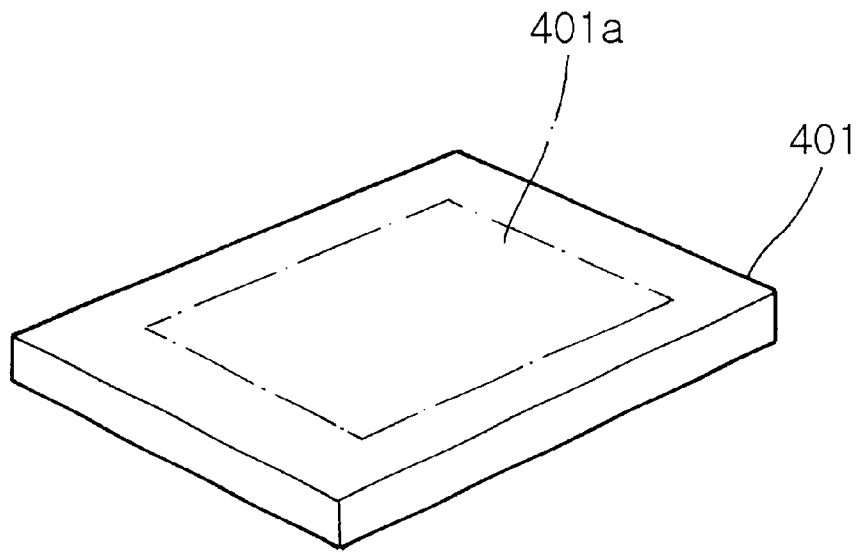
FIGS. 5a to 5d are a perspective view and a cross-sectional view showing a process of manufacturing a temperature compensated crystal oscillator according to present invention.

First, a main board 401 is prepared, as shown in FIG. 5a. The main board 401 is manufactured in the same way as that applied in production of a conventional printed circuit board. The main board 401 is provided at its center portion with a component mounting area 401a, and is printed with a predetermined circuit. Also, the main board 401 is provided with contact portions to be connected to conductive pads at its marginal area on which a ring-shaped board is placed in a subsequent step.

Figure 5B:
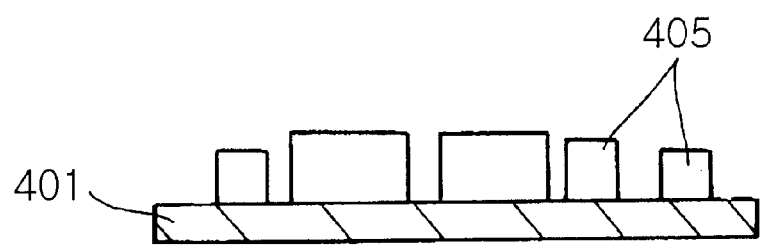

Subsequently, components 405, which are adapted to constitute a temperature compensating circuit, are mounted on the main board 401, as shown in FIG. 5b. Although the components include piezoelectric elements, integrated circuits, capacitors, inductors, resistive elements and so on in the case of discrete type TCXO, the components may comprise only one chip in the case of one-chip type TCXO. Although the present invention can expect to achieve more efficient minimization in the case of discrete type TCXO, the present invention may be efficiently applied to the one-chip type TCXO.

Figure 5C:
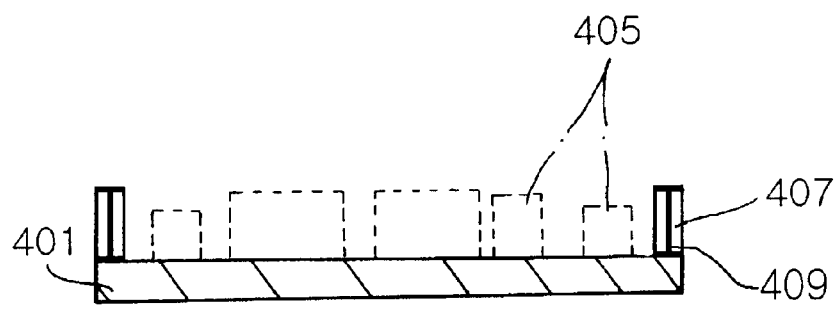
Figure 5D:
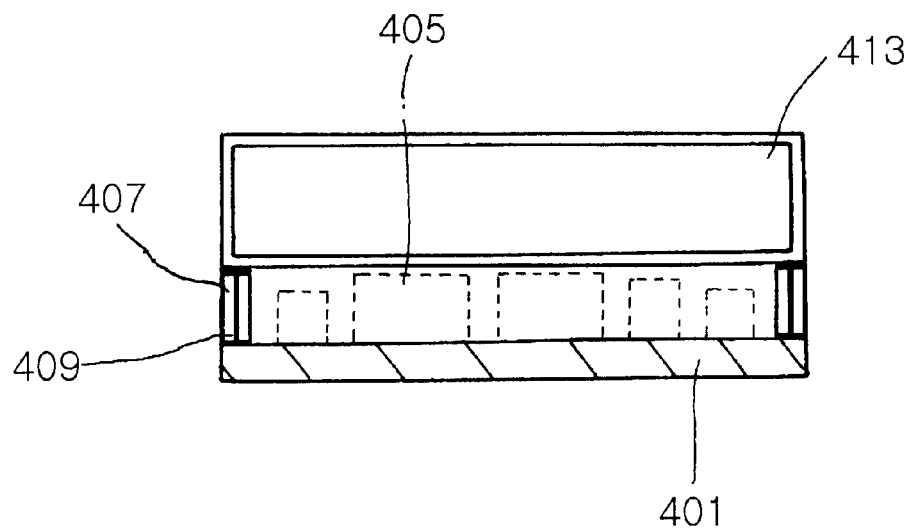

As shown in FIG. 5c, a ring-shaped board 407 having a frame structure is disposed on the main board 401 to surround the component mounting area 401a. At this point, the ring-shaped board 407 is disposed on the main board after mounting of the components 405. The ring-shaped board includes conductive regions provided at its upper and lower surface, and conductive pads consisting of conductive holes connecting the upper regions to the lower conductive regions.

If the ring-shaped board is first disposed on the main board, it is inconvenient to mount the components on the main board owing to the presence of the ring-shaped board of a certain height, thereby increasing possibility of poor connection of components. As opposed to the present invention, when a main board is simply formed thereon with grooves to mount components, it is considerably difficult to achieve flatness of the main board and circuit formation thereon. Therefore, application of the ring-shaped board according to the present invention can facilitate a mounting operation of components and maximize flexibility of process design.

Finally, a crystal package 413 is disposed on the ring-shaped board 407, as shown in FIG. 4d. At this point, the crystal package 413 is electrically connected to a circuit on the main board 401 by means of conductive pads provided at the ring-shaped board 407.

As described above, according to the present invention, a ring-shaped board is disposed on a main board to accommodate components for constituting a temperature compensating circuit on the main board, and a crystal package is disposed on the ring-shaped board. Therefore, since an area of a main board required for mounting of components is reduced, overall size of a finished product can be remarkably reduced. In addition, according to the present invention, since mounting of components can be carried out prior to formation of outer terminals, as opposed to mounting components in a cavity formed in a main board, it is very easy to mount components.

Although preferred embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A temperature compensated crystal oscillator including a crystal package and at least one component for compensating frequency variation of the crystal package due to temperature variation, the crystal oscillator further comprising;
    a ring-shaped board disposed under the crystal package and comprising a frame structure having an inner space, the inner space being at least as large as a space required to accommodate the temperature compensating component: and
    a main board disposed under the ring-shaped board and on which the temperature compensating component is mounted within an area corresponding to the inner space of the ring-shaped board.

2. The temperature compensated crystal oscillator as set forth in claim 1, wherein the ring-shaped board has a frame structure coinciding with the crystal package in contour.

3. The temperature compensated crystal oscillator as set forth in claim 1, wherein the main board has the same area as that of the crystal package.

4. The temperature compensated crystal oscillator as set forth in claim 1, wherein the temperature compensated crystal oscillator has a hexahedral structure.

5. The temperature compensated crystal oscillator as set forth in claim 1, wherein the ring-shaped board includes at least one conductive pad for connecting the crystal package to a certain circuit on the main board.

6. The temperature compensated crystal oscillator as set forth in claim, 5, wherein the ring-shaped board has a rectangular structure, and the conductive pad is positioned at each of four corners of the ring-shaped board.

7. A method of manufacturing a temperature compensated crystal oscillator including a crystal package and at least one component for compensating frequency variation of the crystal package due to temperature variation, the method comprising the steps of:
    preparing a main board having an upper surface including an area required for mounting of the temperature compensating component placing the temperature compensating component on the component mounting area of the main board: placing a ring-shaped board on, the main board, the ring-shaped board having an inner space at least as large as the component mounting area; and
    placing the crystal package on the ring-shaped board.

8. The method as set forth in claim 7, wherein the component mounting area of the main board is positioned at the center portion of its upper surface.

9. The method as set forth in claim 7, wherein the ring-shaped board has a frame structure coinciding with the crystal package in contour.

10. The method as set forth in clam 7, wherein the main board has the same area as that of the crystal package.

11. The method as set forth in claim 7, in which the ring-shaped board includes at least one conductive pad for connecting the crystal package to a certain circuit on, the main board.

12. The method as set forth in claim 11, wherein the ring-shaped board has a rectangular structure, and the conductive pad is positioned at each of tour corners of the ring-shaped board.

13. The oscillator of claim 1, wherein the ring-shaped board and the main board are separate bodies.

14. The method of claim 7, wherein the step of placing the temperature compensating component on the main board is performed before the step of placing the ring-shaped board on the main board.

15. The method of claim 7, further comprising the step of preparing the ring-shaped board as an element separate from the main board.

16. The method of claim 7, wherein the steps are performed in the stated order.

17. A temperature compensated crystal oscillator manufactured by the method of claim 14.

* * * * *